United States Patent
Jang et al.

[11] Patent Number: 5,877,031
[45] Date of Patent: Mar. 2, 1999

[54] METHOD FOR FORMING A METALLIC BARRIER LAYER IN SEMICONDUCTOR DEVICE

[75] Inventors: Hyun Jin Jang; Woo Bong Lee; Young Hwa Mun; Young Ho Jeon; Jae Wan Koh; Young Mo Koo; Se Jeong Kim, all of Bubaleub, Rep. of Korea

[73] Assignee: Hyundai Electronics Industries Co, Ltd, Rep. of Korea

[21] Appl. No.: 499,791

[22] Filed: Jul. 7, 1995

[30] Foreign Application Priority Data

Jul. 7, 1994 [KR] Rep. of Korea ............... 1994-16350
Jul. 8, 1994 [KR] Rep. of Korea ............... 1994-16509
Jul. 8, 1994 [KR] Rep. of Korea ............... 1994-16514

[51] Int. Cl.$^6$ .................. H01L 21/223; H01L 21/383
[52] U.S. Cl. .............. 437/190; 437/192; 437/165; 427/528
[58] Field of Search .................. 437/190, 192, 437/247, 165; 148/900, 669, DIG. 83; 427/528

[56] References Cited

U.S. PATENT DOCUMENTS 4,968,886 11/1990 Wan et al.
4,987,102 1/1991 Nguyen et al. ............... 437/238
5,250,467 10/1993 Somekh et al. ............... 437/192
5,420,070 5/1995 Matsuura et al. ............... 437/190
5,449,641 9/1995 Maeda ............... 437/195

FOREIGN PATENT DOCUMENTS 63-124411 5/1988 Japan .
2-26051 1/1990 Japan .
5-102065 4/1993 Japan .
5-291177 11/1993 Japan .
6-110198 4/1994 Japan .

*Primary Examiner*—John Niebling
*Assistant Examiner*—C. Everhart
*Attorney, Agent, or Firm*—Blakely Sokoloff Taylor & Zafman

[57] ABSTRACT

The present invention relates to a method for forming a TiNO metallic barrier layer acting as a diffusion barrier to intercept the diffusing of the Si atoms between metal layers, the method comprising the steps of: forming a TiN film through a sputtering equipment using Ar and $N_2$ gas; implanting $N_2O$ gas on the upper part of the TiN film; and annealing the resulting structure at $N_2$ atmosphere for diffusing oxygen ions, thereby forming said resulting structure into uniform TiNO film.

4 Claims, 3 Drawing Sheets

METHOD FOR FORMING A METALLIC BARRIER LAYER IN SEMICONDUCTOR DEVICE

BACKGROUND OF THE INVENTION

1. Field of the invention

The present invention relates to a method for forming a metallic barrier layer to connect electrically multi-layers in the manufacturing process of semiconductor devices, and in particular, relates to a method for forming a diffusion metallic barrier layer of a TiNO structure.

2. Description of the Prior Art

In general, aluminum alloy is used with a metallic barrier layer so as to prevent the junction spiking and decrease the resistance in a contact portion when a sub-micron device having a shallow junction is manufactured.

On the other hand, a double structure comprising Ti/TiN films is mainly used as the metallic barrier layer in convenience. The TiN film is used as a diffusion barrier to intercept the diffusing of Si atoms between the metal layers. For perfect intercepting, a composition rates of TiN must be 1 to 1.

However, the present sputtering equipment has difficulty in controlling the rates to be 1 to 1.

Also, the TiN film is not efficient in intercepting the diffusing of the atoms because of its porousness.

SUMMARY OF THE INVENTION

Therefore, the present invention has been made in view of the above problems, and it is an object of the present invention to provide a method for forming a TiNO metallic barrier layer which has a more dense structure than the TiN metallic barrier layer.

To archive this object, according to an aspect of the present invention, there is a method for forming a TiNO metallic barrier layer acting as a diffusion barrier to intercept the diffusing of the atoms between metal layers, the method comprising the steps of: forming a TiN film through a sputtering equipment using the Ar and $N_2$ gas; implanting $N_2O$ gas on the upper part of the TiN film; and annealing the resulting structure at $N_2$ atmosphere for diffusing oxygen ions, thereby forming the resulting structure into uniform TiNO film.

According to another aspect of the present invention, there is a method for forming a TiNO metallic barrier layer acting as a diffusion barrier to intercept the diffusing of the atoms between metal layers, the method comprising the steps of: forming a TiN film in the forming portion of the metallic barrier layer; and implanting oxygen ions into the TiN film by plasma processing the TiN film at oxygen atmosphere and temperature of 300° to 500° C. through the Plasma Enhanced Chemical Vapor Deposition (PECVD) method.

According to the another aspect of the present invention, there is a method for forming a TiNO metallic barrier layer acting as a diffusion barrier to intercept the diffusing of the atoms between metal layers, the method comprising the steps of: forming a Ti film; positioning oxygen atoms in the center of the Ti film by implanting oxygen ions on the Ti film; and annealing the resulting structure at $N_2$ atmosphere, thereby forming the resulting structure into uniform TiNO film.

BRIEF DESCRIPTION OF THE DRAWINGS

The above and other objects, features and advantages of the present invention will be better understood from the following description taken in conjunction with the accompanying drawings.

DETAILED DESCRIPTION OF THE INVENTION

The present invention will be described in detail referring to FIG. 1A through FIG. 1C, FIG. 2A through FIG. 2C and FIG. 3A through FIG. 3C.

Figure 1A:
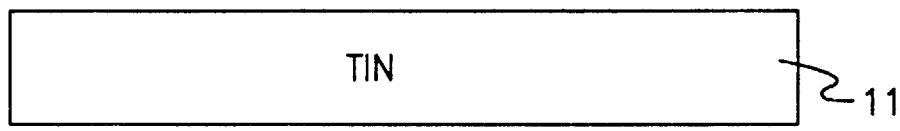
FIG. 1A through FIG. 1C are cross-sectional views illustrating a method for forming a metallic barrier layer according to the first embodiment of the present invention.
Figure 1B:
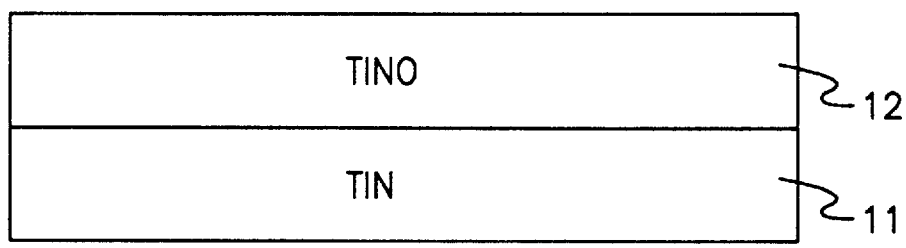
Figure 1C:
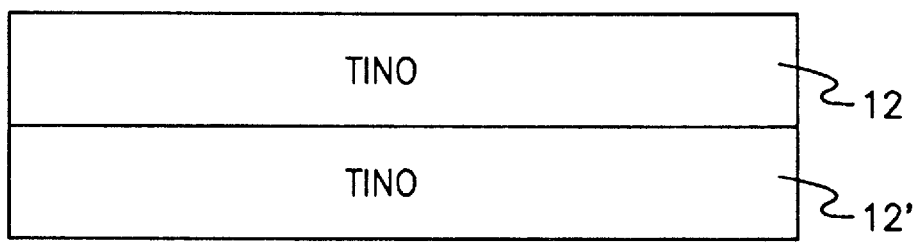

FIG. 1A through FIG. 1C are cross-sectional views illustrating a method for a metallic barrier layer according to the first embodiment of the present invention.

First, a TiN film 11 is formed through a sputtering equipment which uses Ar of 0 to 50 sccm and $N_2$ of 30 to 1000 sccm, as shown in FIG. 1A.

Next, a TiNO film 12, which has a more dense structure than the TiN film 11, is formed by implanting $N_2O$ gas of 5 to 200 sccm into the upper part of the TiN film 11, as shown in FIG. 1B. The process is executed in two steps for preventing a negative influence due to the rising of the resistance of the TiN film 11 when oxygen atoms exist excessively in the TiNO film 12.

Finally, the excess oxygen ions in the TiNO film 12 are diffused into the TiN film 11 by annealing it at $N_2$ atmosphere and temperature of 200° to 500° C., as shown in FIG. 1C.

Figure 2A:
FIG. 2A through FIG. 2C are cross-sectional views illustrating a method for forming a metallic barrier layer according to the second embodiment of the present invention.
Figure 2B:
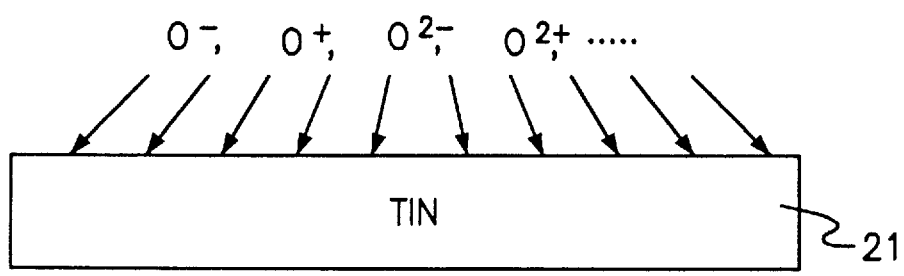
Figure 2C:
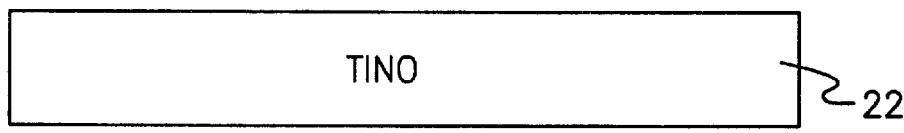

FIG. 2A through FIG. 2C are cross-sectional views illustrating a method for forming a metallic barrier layer according to the second embodiment of the present invention.

First a TiN film 21 is formed on the forming portion of the metallic barrier layer, as shown in FIG. 2A.

Next, $O^{-2}$, $O^-$, $O^+$ and $O^{2+}$ ions are implanted into the TiN film 21 by plasma processing the TiN film 21 at oxygen atmosphere and temperature of 300° to 500° C. through the PECVD method, as shown in FIG. 2B. At this time, the unstable TiN film 21, in initial deposition stage, can be easily combined with the oxygen ions because the temperature of a wafer is over 300° C. Also, the temperature provides activate energy to the implanted ions.

As a result, a TiNO film 22 is formed by the above process, as shown in FIG. 2C.

Figure 3A:
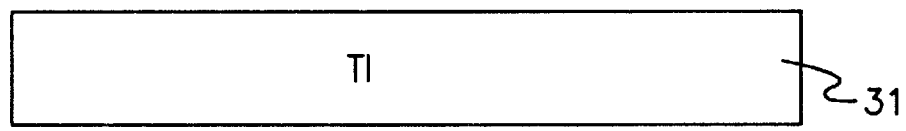
FIG. 3A through FIG. 3C are cross-sectional views illustrating a method for forming a metallic barrier layer according to the third embodiment of the present invention.
Figure 3B:
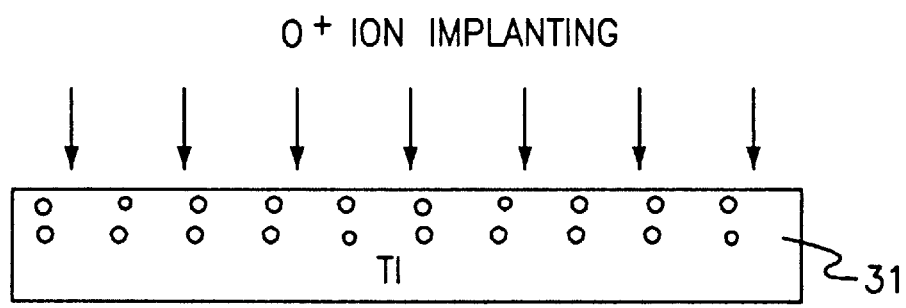
Figure 3C:
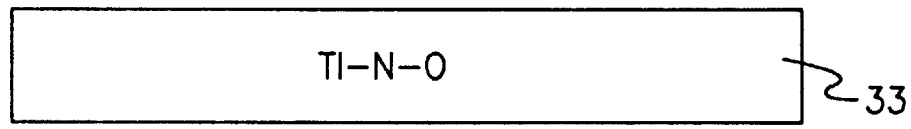

FIG. 3A through FIG. 3C are cross-sectional views illustrating a method for forming a metallic barrier layer according to the third embodiment of the present invention.

First, a Ti film 31 having a thickness over 300 Å is formed, as shown in FIG. 3A.

Next, oxygen ions are implanted on the surface of the Ti film 31 through an ion implanting system, as shown in FIG. 3B. At this time, the ions are implanted until the oxygen atoms are positioned at about half the thickness of the ti film 31.

Finally, the diffusion barrier film 33 having TiNO structure is formed by annealing it at $N_2$ atmosphere, as shown FIG. 3C.

Here, the annealing process is executed over 660° C. in the case of the Rapid Thermal Process (RPT) and 450° C. in the case of the furnace. A part of the oxygen atoms in the Ti film is diffused into its bottom and another part of oxygen atoms is diffused into its surface during the annealing process at $N_2$ atmosphere. As a result, the metallic barrier layer having the TiNO structure can be made. At this time, it is important to control the amount of the implanted ions so that oxygen ions exist below 10% in the TiNO film, because the device can be negative influenced due to the excessive existence of oxygen ions.

According to the process of the present invention, the metallic barrier layer having the TiNO structure can act as a defusion barrier because it has a dense structure in which the diffusing of the atoms is not easy.

Also, the stress of the film can be lessen because its shallow thickness acts as an excellent barrier. Also, it can achieve the stable effects to the junction leakage current in the sub-micron shallow junction.

What is claimed is:

1. A method for forming a TiNO metallic barrier layer comprising the steps of:

forming a Ti film by sputter deposition;

implanting oxygen ions into said Ti layer, wherein the depth of the implantation is about half the thickness of said Ti layer; and annealing the resulting structure in a $N_2$ atmosphere.

2. The method according to claim 1, wherein said Ti layer is formed using Ar gas which is injected at a flow rate of 50 sccm or less.

3. The method according to claim 2, wherein said annealing process is a rapid thermal process executed at approximately 660° C.

4. The method according to claim 2, wherein said annealing process is furnace annealing executed at approximately 450° C.

* * * * *

UNITED STATES PATENT AND TRADEMARK OFFICE
CERTIFICATE OF CORRECTION

PATENT NO. : 5,877,031
DATED : March 2, 1999
INVENTOR(S) : Jang et al.

It is certified that error appears in the above-identified patent and that said Letters Patent is hereby corrected as shown below:

In column 2, line 42, delete "$O^{-2}$, $O^{-}$, $O^{+}$ and $O^{2+}$ ions" and insert -- $O^{-2}$, $O^{-}$, $O^{+}$ and $O^{2+}$ ions -- .

In column 2, line 57, delete "the ti film" and insert -- the Ti film -- .

Signed and Sealed this

Twentieth Day of February, 2001

*Attest:*

NICHOLAS P. GODICI

*Attesting Officer*   *Acting Director of the United States Patent and Trademark Office*